Nov. 1, 1966 D. DE WITT ETAL 3,283,223

TRANSISTOR AND METHOD OF FABRICATION TO MINIMIZE SURFACE RECOMBINATION EFFECTS

Filed Dec. 27, 1963

INVENTORS
DAVID DE WITT
THOMAS G. STEHNEY

BY Lester W. Clark

ATTORNEY

United States Patent Office 3,283,223

Patented Nov. 1, 1966

3,283,223

TRANSISTOR AND METHOD OF FABRICATION TO MINIMIZE SURFACE RECOMBINATION EFFECTS

David De Witt, Poughkeepsie, N.Y., and Thomas G. Stehney, Rillton, Pa., assignors to International Business Machines Corporation, New York, N.Y., a corporation of New York Filed Dec. 27, 1963, Ser. No. 333,882
6 Claims. (Cl. 317—235)

This invention relates to transistors having low surface recombination effects, and methods of making such transistors.

One of the factors which limits the current gain of a transistor is an effect known as surface recombination, by which minority current carriers injected into the base region at the emitter-base junction tend to recombine rapidly with majority carriers if the current paths of the minority carriers take them near the surface of the semiconductor body.

It has been proposed to utilize magnetic fields to confine the minority carriers to regions of the transistor body as far as possible from the surfaces thereof so as to limit the surface recombination.

An object of the present invention is to provide a transistor structure in which surface recombination is limited inherently by the geometry of the transistor.

Another object of the invention is to provide a transistor structure which includes a direct linear internal path between an internal portion of the emitter-base junction and the base contact, and a tortuous path between surface portions of the emitter-base junction and the base contact.

A further object is to provide a transistor structure in which the collector region serves as a screen between the peripheral portions of the emitter-base junction and the base contact.

Another object is to provide an improved method of making a transistor of the type described.

The foregoing and other objects of the invention are attained in the embodiments of the invention described herein. One of those embodiments includes a semiconductor body having opposed plane surfaces with a base contact covering one of the two plane surfaces. A peripheral surface extends around the body between the two plane surfaces. The base region of the transistor body extends from the base contact plane surface toward the other plane surface. The emitter region is located adjacent the other plane surface and is located inwardly from the peripheral surface. The collector region extends inwardly from the peripheral surface toward the center of the transistor far enough so that its inner periphery lies between the emitter region and the plane surface carrying the base contact. Various configurations and contours of the transistor structure are possible.

One embodiment of the improved method of making a transistor is described herein. That method includes starting with a body of semiconductor material of one impurity type, having two opposed plane surfaces, masking a central portion of one of the plane surfaces and diffusing into the remainder of that plane surface a collector region of the opposite impurity type. On the plane surface where the opposite type impurity has been diffused there is then deposited an epitaxial layer of the first type impurity. After this layer has been built up to a sufficient thickness, an emitter region of the second type impurity is diffused into the middle of it in alignment with the central portion of the opposite plane surface. Conventional contact structures for the base, emitter and collector are then added.

Other objects and advantages of the invention will become apparent from a consideration of the following specification and claims, taken together with the accompanying drawing.

Figure 1:
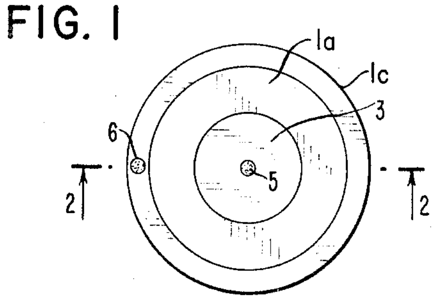
FIG. 1 is a plan view of a transistor embodying the invention.
Figure 2:
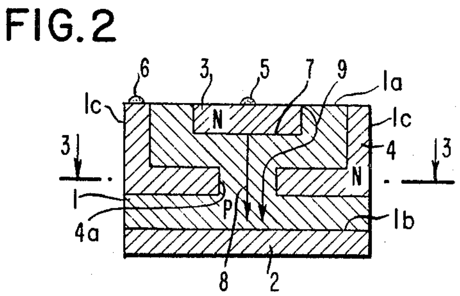
FIG. 2 is a sectional view taken on the line 2—2 of FIG. 1.
Figure 3:
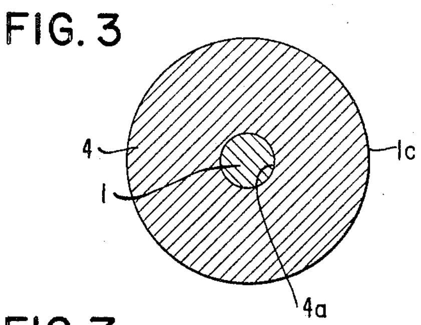
FIG. 3 is a sectional view taken on the line 3—3 of FIG. 2.
Figure 12:
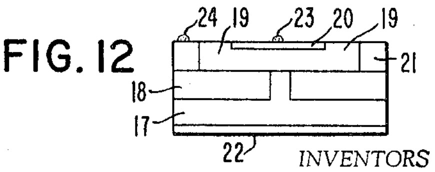

FIGS. 8, 9, 10, 11 and 12 respectively show diagrammatically successive steps in the process of making a transistor according to the invention, the finished transistor being illustrated in FIG. 12 and corresponding generally to the one shown in FIGS. 1 to 3.

FIGURES 1–3

These figures illustrate a transistor including a body 1 of P-type semiconductor material having opposed flat surfaces 1*a* and 1*b*. The bottom surface 1*b* is covered by a layer 2 of ohmic material, which provides a contact to the base region. At the center of the top surface 1*a*, there is diffused into the body 1 a region 3 of N-type material. The plane surfaces 1*a* and 1*b* are connected, by a peripheral surface 1*c*, shown as being cylindrical. Between and spaced from both the plane surfaces 1*a* and 1*b*, there is provided another N-region 4 extending inwardly from the peripheral surface 1*c*, with its inner periphery 4*a* substantially within the outer periphery of the emitter region 3. At its outer margin, the region 4 extends upwardly to the surface 1*a*. A suitable ohmic emitter contact is provided at 5 and an ohmic collector contact at 6.

The emitter-base junction is shown at 7 and is located at the boundary between the region 3 and the N-type material of body 1, which constitutes the base region. It may be seen that the current flow path between the central portion of the emitter-base junction 7 and the base contact 2 is a linear path, as indicated by the reference numeral 8. It may further be seen that the current flow path between the periphery of the junction 7, near the surface 1*a*, and the same base contact 8, is a tortuous path, as indicated by the arrow 9. Furthermore, the path 9 is substantially longer than the path 8 and so has a greater resistance. Consequently, the potential drop due to the base current flow (the majority carrier current) is greater at the peripheral portion of the junction 7 than it is at the central portion, and the actual applied potential across the junction is greatest at the center. This causes most of the majority carrier injection to take place in the central portion and minimizes the injection near the periphery which is subject to surface recombination.

FIGURES 4–6

These figures illustrate a modified form of transistor structure corresponding generally to that shown in FIG. 1. The structure in FIGS. 4 to 6 includes a body 10 of P-type material serving as a base region and having opposed plane surfaces 10*a* and 10*b*. The surface 10*b* is covered by a wide area base contact 11. An emitter region 12 of N-type material is diffused in from the surface 10*a* and is located inwardly from the periphery of the transistor body. The surfaces 10*a* and 10*b* are connected by peripheral surfaces 10*c*. Extending inwardly from the surfaces 10*c* is a collector region 13 of N-type material shown as including a plurality of bars 13*a* extending across the center of the transistor and separated by bars 10*d* of P-type material.

The boundary of the emitter region 12 forms an emitter-base junction 14. The current path between the under surface of the junciton 14, as it appears in FIG. 5, and base contact 10*a* is a direct linear path, as shown by the arrow 15. The current path between the periphery of the junction 14 and the base 11 is a tortuous path, as indicated by the arrow 16 and is substantially longer than the path 15.

FIGURES 7–12

Figure 4:
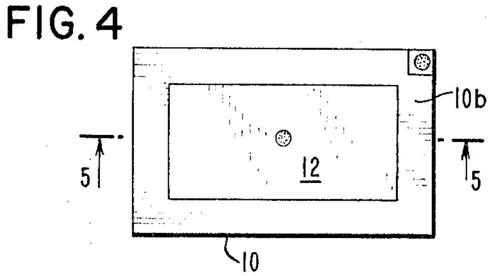
FIG. 4 is a plan view of a modified form of transistor embodying the invention.
Figure 5:
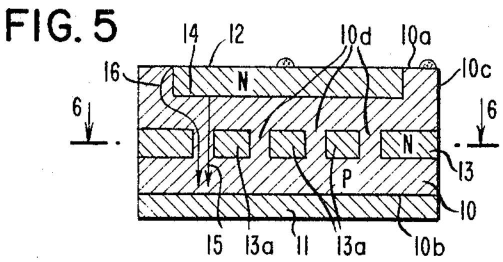
FIG. 5 is a sectional view taken on the line 5—5 of FIG. 4.
Figure 6:
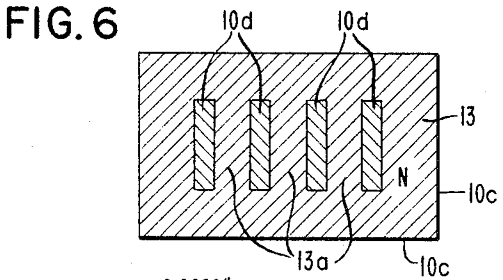
FIG. 6 is a sectional view taken on the line 6—6 of FIG. 5.
Figure 7:
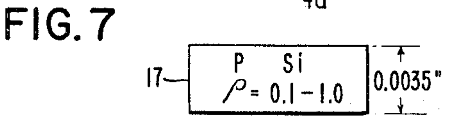
FIG. 7 is a diagrammatic view of a block of material serving as a starting material in the process according to the invention.
Figure 11:
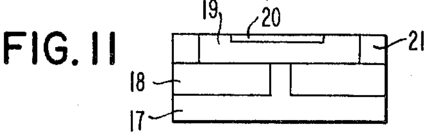

These figures illustrate one embodiment of a suitable method for making either a transistor of the type shown in FIGS. 1 to 3 or a transistor of the type shown in FIGS. 4 to 6. The starting material is shown in FIG. 7 as a block of P-type silicon 3.5 mils thick and having a resistivity in the range from 0.1 to 1.0 ohm-cm. It should be understood that the dimensions, resistivities and materials stated herein are given by way of example only, and that the invention is not limited to any of those examples.

Figure 8:
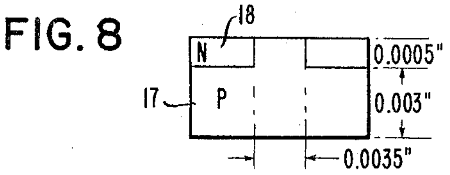

The first step in the process is illustrated in FIG. 8, and consists of diffusing into the top surface of the body 17 an N-type region 18. Arsenic is a suitable impurity for diffusion. Any sutiable masking should be used over the central region of the upper surface of the body 17 so as to confine the region 18 to the peripheral areas. A concentration of arsenic of about $10^{19}$ atoms per cubic centimeter is preferred. As indicated in the drawing, the diffusion may be carried out to a depth of about 0.5 mil.

Figure 9:
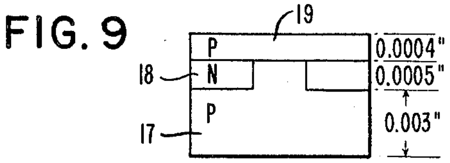

The third step in the process is to remove the masking and deposit an epitaxial layer 19 over the entire upper surface of the transistor as viewed in FIG. 9. This layer may have a depth of about 0.4 mil and a resistivity in the range from 0.1 to 1.0 ohm-cm.

Figure 10:
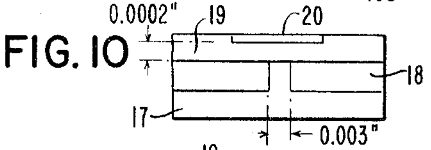

The fourth step in the process is shown in FIG. 10, and consists of diffusing into the central portion of the region 19 an emitter region 20 of N-type material. The impurity may again be arsenic. The depth of diffusion may be about 0.1 mil and the concentration about $10^{19}$ atoms per cubic centimeter. Any suitable masking of the surfaces where diffusion is not desired may be used. For example, a coating of silicon dioxide is effective. During this diffusion step, the arsenic in the collector region 18 will diffuse a little farther, resulting in a narrowing of the width of the base region at the center of the collector region. As shown in the drawing, this dimension may be about 3 mils. A similar diffusion and expansion of the collector region will take place on its upper surface. The thickness of the base region between the upper surface of the collector region and the emitter-base junction may be about 0.2 mil.

The next step is to diffuse into the periphery of the transistor body, adjacent its upper surface, a small ring 21 of N-type material to serve as a collector contact. Phosphorus may be used as the impurity material for this diffusion step, since it may be diffused at lower temperatures and hence outdiffusion or spreading of the arsenic will not be excessive.

The final step in the process is to provide suitable electrical contacts such as the wide area base contact 22, emitter contact 23 and collector contact 24, for the attachment of wires.

While we have shown and described a preferred embodiment of our invention, other modifications thereof will readily occur to those skilled in the art, and we therefore intend our invention to be limited only by the appended claims.

What is claimed is:

1. A transistor comprising:

(a) a semiconductor body having emitter, base and collector regions and having opposed parallel plane surfaces with a peripheral surface therebetween;

(b) individual connections to said emitter, base and collector regions;

(c) said emitter and base regions being separated by a barrier junction having a peripheral intersection with one of said plane surfaces of said body;

(d) said collector region extending inwardly of the peripheral surface and within the semiconductor body at a locality between and spaced from said plane surfaces, said region extending inwardly in opposite directions a substantial distance beyond the outer periphery of the emitter region and having a portion extending to said one of said parallel plane surfaces;

(e) said base region being thereby contoured to define a relatively short rectilinear path located remotely from any surface of said body for current flow between said base connection and an internal portion of said barrier junction remote from said intersection and a relatively long tortuous path for current flow between said base connection and the peripheral margin of said barrier junction, whereby the flow of injected minority carriers adjacent the surface of the body is minimized.

2. A transistor as defined in claim 1, in which said collector region extends between the base connection and at least the peripheral margin of the barrier junction, and substantially encloses at least one portion of the base region defining said rectilinear path.

3. A transistor comprising:

(a) a semiconductor body having opposed parallel plane surfaces and a peripheral surface therebetween;

(b) an emitter region extending inwardly from the central portion of one of said plane surfaces and spaced from the periphery of said one plane surface;

(c) a collector region extending to said one plane surface and around the entire peripheral surface of the semiconductor body at a locality spaced from the other plane surface, said region having a portion extending inwardly from said peripheral surface a substantial distance beyond the outer periphery of the emitter region; and (d) a base region extending from the other plane surface past the inner end of the collector region and to the one plane surface at the periphery of the emitter region.

4. A transistor as defined in claim 3, including an electrical connection to the base region at a point on said other plane surface substantially aligned with the portion of the base region extending past the inner end of the collector region.

5. A transistor as defined in claim 3, in which said transistor body is of circular cross-section, and said collector region is of annular cross-section, so that the portion of the base region extending past the inner end of the collector region is a single central portion.

6. A transistor as defined in claim 3, in which said transistor body is of rectangular cross-section, and said collector region and said base region include a plurality of alternating bars aligned with said emitter region.

References Cited by the Examiner

UNITED STATES PATENTS

| | | | |
|---|---|---|---|
| 2,837,704 | 6/1958 | Emeis | 317—235 |
| 3,093,520 | 6/1963 | John et al. | 317—235 |
| 3,156,591 | 10/1964 | Hale et al. | 117—200 |
| 3,171,042 | 2/1965 | Matare | 317—235 |
| 3,183,129 | 5/1965 | Tripp | 317—235 |
| 3,197,681 | 7/1965 | Broussard | 307—88.5 |

OTHER REFERENCES

IBM Technical Disclosure Bulletin, "Epitaxially Diffused Transistor Fabrication" by Van Ligten, vol. 4, No. 10, pages 58 and 59, March 1962.

JOHN W. HUCKERT, *Primary Examiner.*

J. D. CRAIG, *Assistant Examiner.*